United States Patent
Fujii

(10) Patent No.: US 9,106,193 B2
(45) Date of Patent: Aug. 11, 2015

(54) VARIABLE GAIN AMPLIFIER

(71) Applicant: KABUSHIKI KAISHA TOSHIBA, Tokyo (JP)

(72) Inventor: Shinsuke Fujii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 14/015,965

(22) Filed: Aug. 30, 2013

(65) Prior Publication Data

US 2014/0253235 A1  Sep. 11, 2014

(30) Foreign Application Priority Data

Mar. 7, 2013  (JP) ................... 2013-045251

(51) Int. Cl.
*H03F 3/45* (2006.01)
*H03G 1/00* (2006.01)

(52) U.S. Cl.
CPC ............... *H03G 1/0088* (2013.01); *H03F 3/45* (2013.01)

(58) Field of Classification Search
CPC ........................................................ H03F 3/45
USPC ........................................ 330/252, 253, 254
See application file for complete search history.

(56) References Cited

U.S. PATENT DOCUMENTS

| | | |
|---|---|---|
| 6,982,596 B2 | 1/2006 | Kumeta et al. |
| 7,034,606 B2 | 4/2006 | Caresosa et al. |
| 7,420,410 B2 | 9/2008 | Ohba |
| 7,598,811 B2 * | 10/2009 | Cao ................... 330/304 |
| 2006/0044061 A1 * | 3/2006 | Mukherjee et al. ......... 330/253 |

FOREIGN PATENT DOCUMENTS

| | | | |
|---|---|---|---|
| JP | 50110753 | A | 9/1975 |
| JP | 5927612 | A | 2/1984 |
| JP | 2006067607 | A | 3/2006 |
| JP | 2009290682 | A | 12/2009 |
| JP | 4922846 | B2 | 4/2012 |

OTHER PUBLICATIONS

Dianyong Chen et al., Decision-Feedback-Equalizer for 10-Gb/s Backplane Transceivers for Highly Lossy 56-inch Channels, International Conference on Communications, Circuits and Systems, 2008, pp. 594-598.
Japanese Office Action dated Jun. 9, 2015, filed in Japanese counterpart Application No. 2013-045251, 10 pages (with translation).
Japanese Office Action dated Jun. 9, 2015, filed in Japanese counterpart Application No. 2013-045251, 3 pages.

* cited by examiner

*Primary Examiner* — Steven J Mottola
(74) *Attorney, Agent, or Firm* — Patterson & Sheridan, LLP

(57) ABSTRACT

According to an embodiment, a variable gain amplifier includes a differential transistor pair including a first and second transistor. A variable resistor for setting a gain is connected between electrodes the transistor pair. A first variable capacitor is connected to an electrode of the first transistor, and a second variable capacitor is connected to an electrode of the second transistor. Corresponding to the gain setting set by adjusting the variable resistor, capacitance values of the variable capacitors can be adjusted to provide improved frequency characteristics of the variable gain amplifier.

10 Claims, 3 Drawing Sheets

VARIABLE GAIN AMPLIFIER

CROSS-REFERENCE TO RELATED APPLICATION

This application is based upon and claims the benefit of priority from Japanese Patent Application No. 2013-045251, filed Mar. 7, 2013, the entire contents of which are incorporated herein by reference.

FIELD

Embodiments described herein relate generally to a variable gain amplifier.

BACKGROUND

In multi-gigabit per second serial transceivers, a variable gain amplifier (VGA) is required at the receiver front end. VGA is mainly used to make internal signal amplitude constant for both small and large input amplitudes. Further it is desirable to have flat frequency response over the operating frequency on all gain settings to prevent increasing inter-symbol interference (ISI) induced jitter. A classical VGA circuit is configured with current mode logic (CML) using a variable source degeneration resistor. However the frequency characteristics of this type VGA vary according to the gain setting (e.g. low pass response at high gain setting and high frequency peaking response at low gain setting).

DETAILED DESCRIPTION

In general, a variable gain amplifier according to an example embodiment will be explained with reference to the figures. However, the present disclosure is not limited to the example embodiment.

In general in many applications it is desirable to provide a variable gain amplifier with flat frequency characteristics over the operating frequency.

According to an embodiment, there is provided a variable gain amplifier including a differential transistor pair having a first transistor and a second transistor. The first and second transistors each have a first electrode (e.g., a source or drain terminal), a second electrode (e.g., a source or drain terminal), and a gate electrode. The variable gain amplifier includes a variable resistor that is connected between the first electrode of the first transistor and the first electrode of the second transistor. The gain of the variable amplifier can be set by adjusting the resistance of the variable resistor. Also included in the variable gain amplifier is a first variable capacitor connected to the first electrode of the first transistor and a second variable capacitor connected to the first electrode of the second transistor.

First Embodiment

Figure 1:
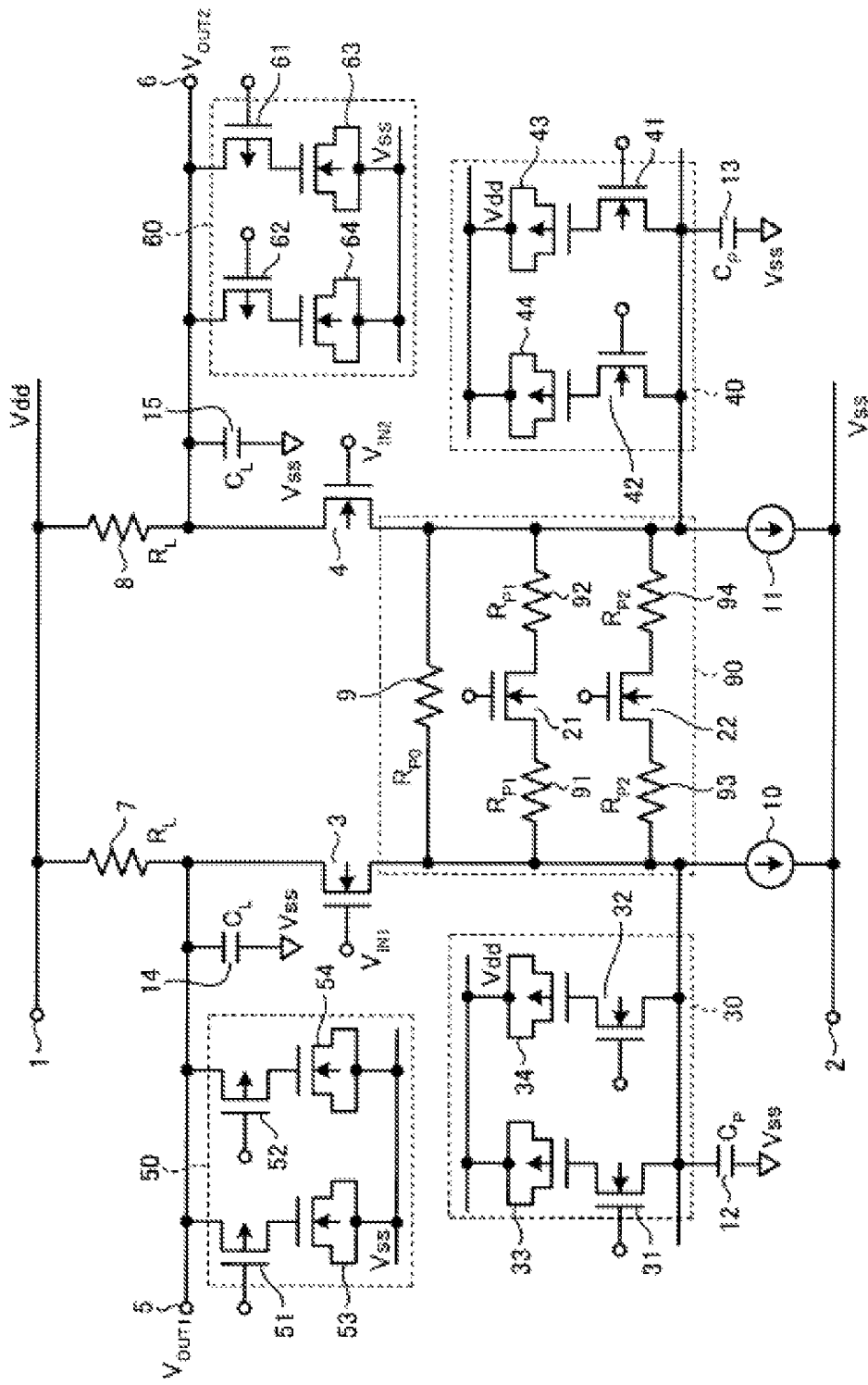
FIG. 1 is a circuit diagram depicting a variable gain amplifier according to a first embodiment.

FIG. 1 is a circuit diagram depicting a variable gain amplifier according to a first embodiment. A voltage (Vdd) of the higher potential level is applied at the power supply terminal 1. A reference potential (Vss) of the lower potential level is applied at the power supply terminal 2. For example, Vdd could be a positive power supply potential and Vss could be a ground potential. An NMOS transistor 3 and an NMOS transistor 4 form a differential pair. The gate electrodes of the NMOS transistors 3 and 4 are the input terminals $V_{IN1}$ and $V_{IN2}$, respectively. The source electrode of the NMOS transistor 3 is connected via a constant current source 10 to the power supply terminal 2. The source electrode of the NMOS transistor 4 is connected via a constant current source 11 to the power supply terminal 2. The constant current sources 10 and 11 may be, for example, NMOS transistors each having a prescribed bias voltage applied to their respective gate electrodes (not shown in the drawing).

A variable resistor 90 is connected between the source electrodes of the NMOS transistors 3 and 4. Here, the variable resistor 90 includes a resistor 9. The variable resistor 90 also has resistors and MOS transistors connected in series to form sections. The resistors and MOS transistors connected in series may sometimes be referred to herein as a "resistance section" and a "resistance serial circuit." The number of the sections of resistors and MOS transistors connected in series is determined corresponding to, e.g., the number of the steps for setting the variable gain requested for the variable gain amplifier. As an example, FIG. 1 shows a configuration including a resistance serial circuit (a resistance section) including a resistor 91, an NMOS transistor 21, and a resistor 92, and a resistance serial circuit (a resistance section) including a resistor 93, an NMOS transistor 22, and a resistor 94. By turning on/off the NMOS transistors 21, 22, it is possible to adjust the resistance value of the variable resistor 90. By adjusting the resistance value of the variable resistor 90, it is possible to set the gain of the variable gain amplifier.

The drain electrode of the NMOS transistor 3 is connected via a load resistor 7 to the power supply terminal 1. The drain electrode of the NMOS transistor 4 is connected via a load resistor 8 to the power supply terminal 1. The drain electrodes of the NMOS transistors 3 and 4 are also connected to output terminals 5 and 6, respectively.

The source electrode of the NMOS transistor 3 is connected to a first variable capacitor 30. The first variable capacitor 30 has plural capacitance sections comprising serial circuits of the MOS transistors and the MOS capacitors. The number of the capacitance sections is adjusted corresponding to the resistance value of the variable resistor 90. For example, the resistance value can be adjusted by changing the number of the resistance sections that are included in the variable resistor 90 or by connecting and disconnecting such sections in the variable resistor 90.

As an example, FIG. 1 shows a serial circuit (capacitance section) including an NMOS transistor 31 and a PMOS capacitor 33, and a serial circuit (capacitance section) including an NMOS transistor 32 and a PMOS capacitor 34. The PMOS capacitors 33, 34 have a structure where the source electrode and the drain electrode of the PMOS transistor are connected in common. As such configuration of the NMOS transistor and PMOS capacitor can be formed in a CMOS process, thus manufacturing can be carried out easily using standard CMOS processes.

The common connection of the source electrodes and the drain electrodes of the PMOS capacitors 33, 34 is connected to the power supply terminal 1, so that the power supply voltage Vdd is supplied. By turning on/off the NMOS transistors 31, 32, the number of the PMOS capacitors connected in parallel can be adjusted, and the capacitance value of the first variable capacitor 30 can be adjusted. A capacitor 12 connected to the source electrode of the NMOS transistor 3 shows a parasitic capacitance.

Similarly, a second variable capacitor 40 is connected to the source electrode of the NMOS transistor 4. The second variable capacitor 40 has plural capacitance sections comprising serial circuits of the MOS transistors and the MOS capacitors. The number of the capacitance sections is adjusted corresponding to the resistance value of the variable resistor 90.

As an example, FIG. 1 shows the serial circuit (capacitance section) of an NMOS transistor 41 and a PMOS capacitor 43, and a serial circuit (capacitance section) of an NMOS transistor 42 and a PMOS capacitor 44. The common connection of the source electrodes and the drain electrodes of the PMOS capacitors 43, 44 is connected to the power supply terminal 1, so that the power supply voltage Vdd is supplied. By turning on/off the NMOS transistors 41, 42, the number of the PMOS capacitors connected in parallel is adjusted, so that the capacitance value of the second variable capacitor 40 is adjusted. A capacitor 13 connected to the source electrode of the NMOS transistor 4 shows a parasitic capacitance. A third variable capacitor 50 is connected to the drain electrode of the NMOS transistor 3. Here, the third variable capacitor 50 has plural capacitance sections of the serial circuits comprising the MOS transistors and the MOS capacitors. The number of the capacitance sections is adjusted corresponding to the resistance value of the variable resistor 90. As an example, FIG. 1 shows a serial circuit (capacitance section) of a PMOS transistor 51 and an NMOS capacitor 53, and a serial circuit (capacitance section) of a PMOS transistor 52 and an NMOS capacitor 54. The NMOS capacitors 53, 54 have a structure where the source electrode and the drain electrode of the NMOS transistor are connected in common. The common connection of the source electrodes and the drain electrodes of the NMOS capacitors 53, 54 is connected to the power supply terminal 2, so that the reference potential Vss is supplied. By turning on/off the PMOS transistors 51, 52, the number of the NMOS capacitors connected in parallel is adjusted, so that the capacitance value of the third variable capacitor 50 is adjusted. The capacitor 14 connected to the drain electrode of the NMOS transistor 3 shows a parasitic capacitance.

A fourth variable capacitor 60 is connected to the drain electrode of the NMOS transistor 4. The fourth variable capacitor 60 has plural capacitance sections of the serial circuits comprising the MOS transistors and the MOS capacitors. The number of the capacitance sections is adjusted corresponding to the resistance value of the variable resistor 90. As an example, FIG. 1 shows a serial circuit (capacitance section) of a PMOS transistor 61 and an NMOS capacitor 63, and a serial circuit (capacitance section) of a PMOS transistor 62 and an NMOS capacitor 64. The common connection of the source electrodes and the drain electrodes of the NMOS capacitors 63, 64 is connected to the power supply terminal 2, so that the reference potential Vss is supplied. By turning on/off the PMOS transistors 61, 62, the number of the PMOS capacitors connected in parallel is adjusted, so that the capacitance value of the fourth variable capacitor 60 is adjusted. The capacitor 15 connected to the drain electrode of the NMOS transistor 4 shows a parasitic capacitance.

A gain H(s) of the variable gain amplifier in the embodiment shown in FIG. 1 is represented by the following equation (1).

[Equation 1]

$$H(s) = \frac{g_m \cdot R_L}{1 + \frac{g_m \cdot R_P}{2}} \cdot \frac{\left\{1 + \frac{s \cdot (C_P + C_{PSW}) \cdot R_P}{2}\right\}}{\left\{1 + s \cdot \frac{\frac{(C_P + C_{PSW}) \cdot R_P}{2}}{1 + \frac{g_m \cdot R_P}{2}}\right\} \cdot \{1 + s \cdot (C_L + C_{LSW}) \cdot R_L\}} \quad (1)$$

Here, the equation (1) represents the gain of the variable gain amplifier as a function of a Laplace operator (s), where gm represents the transconductance of the NMOS transistors 3, 4, $R_L$ represents the resistance value of the load resistors 7, 8, $R_P$ represents the resistance value of the variable resistor 90, $C_P$ represents the capacitance of the parasitic capacitances 12, 13, $C_{PSW}$ represents the capacitance value of first variable capacitor 30 and the second variable capacitor 40, $C_L$ represents the capacitance value of parasitic capacitances 14, 15, and $C_{LSW}$ represents the capacitance value of the third variable capacitor 50 and fourth variable capacitor 60. The parasitic capacitances 12 through 15 can correspond to the basic wiring capacitances that can be extracted from the device layout in the design stage.

According to the equation (1), the variable gain amplifier in the first embodiment has two polar frequencies $\omega_{P1}$ and $\omega_{P2}$ represented in the following listed equations (2) and (3), and one zero point frequency $\omega_Z$ represented by the following listed equation (4).

[Equation 2]

$$\omega p1 = \frac{1}{(C_L + C_{LSW}) \cdot R_L} \quad (2)$$

[Equation 3]

$$\omega p1 = \frac{1 + \frac{g_m \cdot R_P}{2}}{\frac{(C_P + C_{PSW}) \cdot R_P}{2}} \quad (3)$$

[Equation 4]

$$\omega z = \frac{2}{(C_P + C_{PSW}) \cdot R_P} \quad (4)$$

In this embodiment, the polar frequency $\omega_{P1}$ represented in the equation (2) and the zero point frequency $\omega_Z$ represented in the equation (4) are in agreement with each other or close to each other. As a result, the frequency characteristics of a decreased in gain due to the polar frequency $\omega_{P1}$ and the frequency characteristics of an increase in gain due to the zero point frequency $\omega_Z$ can cancel each other, and a flat frequency characteristics can be realized.

When a lower gain is to be set, the resistance value $R_P$ of the variable resistor 90 between the source electrodes of the MOS transistors (3 and 4) as a differential pair can be set to a larger value. In this case, the capacitance value $C_{LSW}$ of the third variable capacitor 50 and the fourth variable capacitor 60 can be increased corresponding to the resistance value $R_P$ so that the polar frequency $\omega_{P1}$ shown in the equation (2) and the zero point frequency $\omega_Z$ shown in the equation (4) are in agreement with each other, or approximately so. More specifically, the number of the PMOS transistors that are turned on among the PMOS transistors connected to the NMOS capacitors of the third variable capacitor 50 and the fourth variable capacitor 60 is increased. On the other hand, the capacitance value $C_{PSW}$ of the first variable capacitor 30 and the second variable capacitor 40 can be decreased. More specifically, the number of the NMOS transistors that are turned off among the NMOS transistors connected to the PMOS capacitors of the first variable capacitor 30 and the second variable capacitor 40 is increased. When all of the NMOS transistors are turned off, the capacitance connected to the source electrodes of the NMOS transistors 3, 4 becomes only the parasitic capacitances 12, 13. In this case, in order to have the polar frequency in agreement with the zero point frequency, the capacitance value $C_{LSW}$ is controlled so that the $1/(C_L+C_{LSW})\cdot R_L$ and the $2/C_P \cdot R_P$ are in agreement with each other, or approximately so.

When a higher gain is to be set, the resistance value $R_P$ can be set to a smaller value. In this case, the capacitance value $C_{PSW}$ of the first variable capacitor 30 and the second variable capacitor 40 can be increased corresponding to the resistance value $R_P$ so that the polar frequency $\omega_{P1}$ shown in the equation (2) and the zero point frequency $\omega_Z$ shown in the equation (4) are in agreement with each other, or approximately so. More specifically, the number of the NMOS transistors that are turned on among the NMOS transistors connected to the PMOS capacitors of the first variable capacitor 30 and the second variable capacitor 40 is increased. On the other hand, the capacitance value $C_{LSW}$ of the third variable capacitor 50 and the fourth variable capacitor 60 is decreased. More specifically, the number of the NMOS transistors that are turned off among the PMOS transistors connected to the NMOS capacitors of the third variable capacitor 50 and the fourth variable capacitor 60 is increased. When all of the PMOS transistors are turned off, the capacitance connected to the drain electrodes of the NMOS transistors 3, 4 becomes only the parasitic capacitances 14, 15. In this case, in order to have the polar frequency in agreement with the zero point frequency, the capacitance value $C_{PSW}$ is controlled so that the $1/C_L \cdot R_L$ and the $2/(C_P+C_{PSW})\cdot R_P$ are in agreement with each other, or approximately so.

Figure 2:
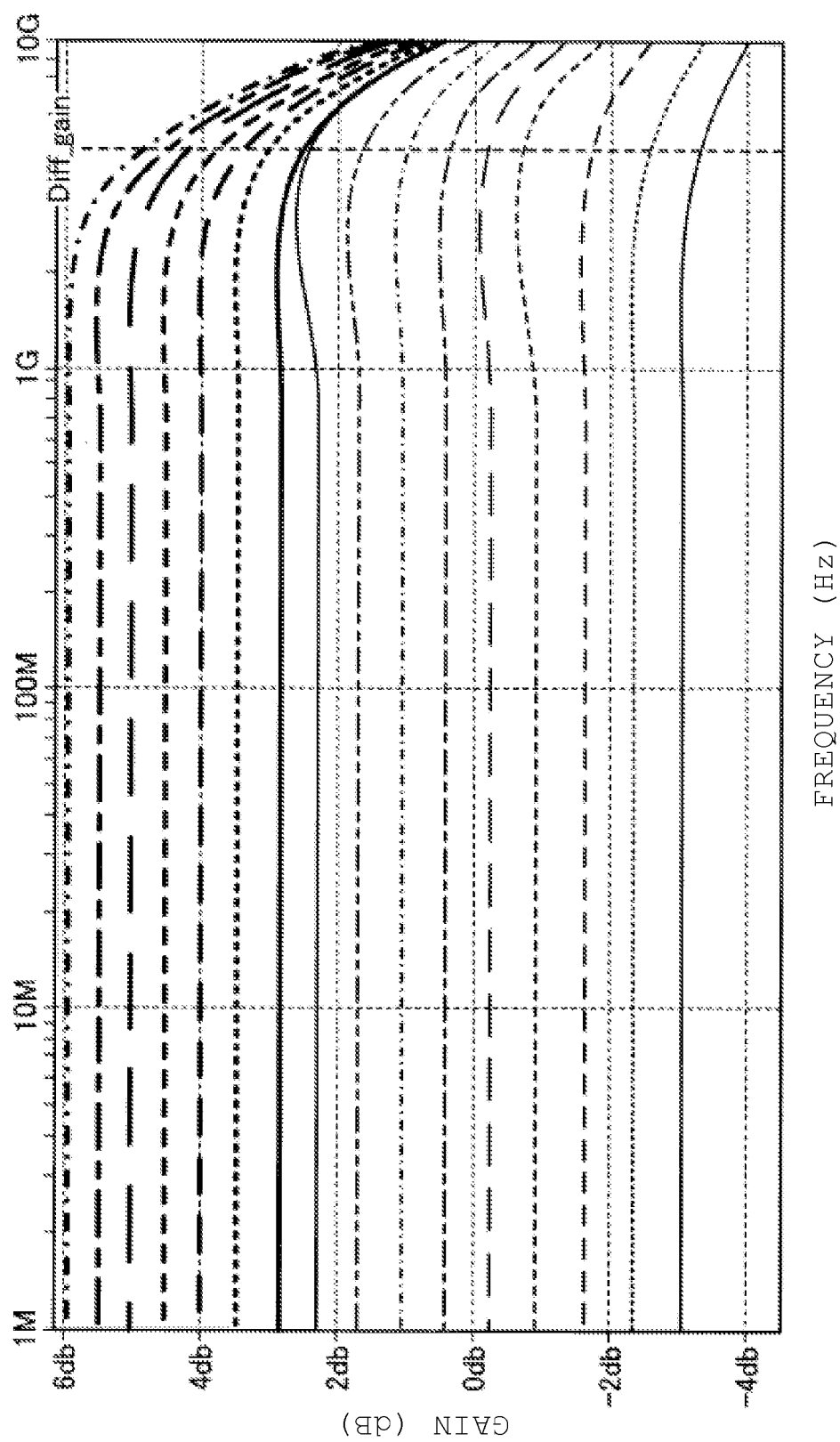
FIG. 2 depicts the results of a simulation of the frequency characteristics in a variable gain amplifier according to the first embodiment.

FIG. 2 is a diagram illustrating the results of the simulation of the frequency characteristics when an 8 Gbps (gigabits/sec) signal as an input signal is input to the variable gain amplifier of the first embodiment. Here, the ordinate represents the gain (dB), and the abscissa represents the frequency (Hz). When the 8 Gbps signal is input, it is desired that the frequency band be 4 GHz. Here, in both setting of the lower gain and the setting of the higher gain, a flat frequency characteristics in a wide frequency band is displayed. As the zero point frequency and the polar frequency are in agreement with each other, by extending the frequency band with a flat gain, it is also possible to realize improvement in the gain in the high frequency region when a higher gain is set. When the gain is set at 6 dB, by having the zero point frequency and the polar frequency in agreement with each other, compared with the case when the two frequencies are not in agreement with each other, the gain is increased by about 0.5 dB at 4 GHz, and the attenuation characteristics can be improved. Improvement in the gain in the high frequency region in a high-gain setting can be realized by connecting a variable capacitor to the source electrodes of the NMOS transistors that form a differential pair and increasing the capacitance value so that the polar frequency and the zero point frequency are made to be in agreement with each other. As a result, for the variable gain amplifier adopted in the present embodiment, it is possible to have a flat frequency characteristics in a wide frequency band.

Second Embodiment

Figure 3:
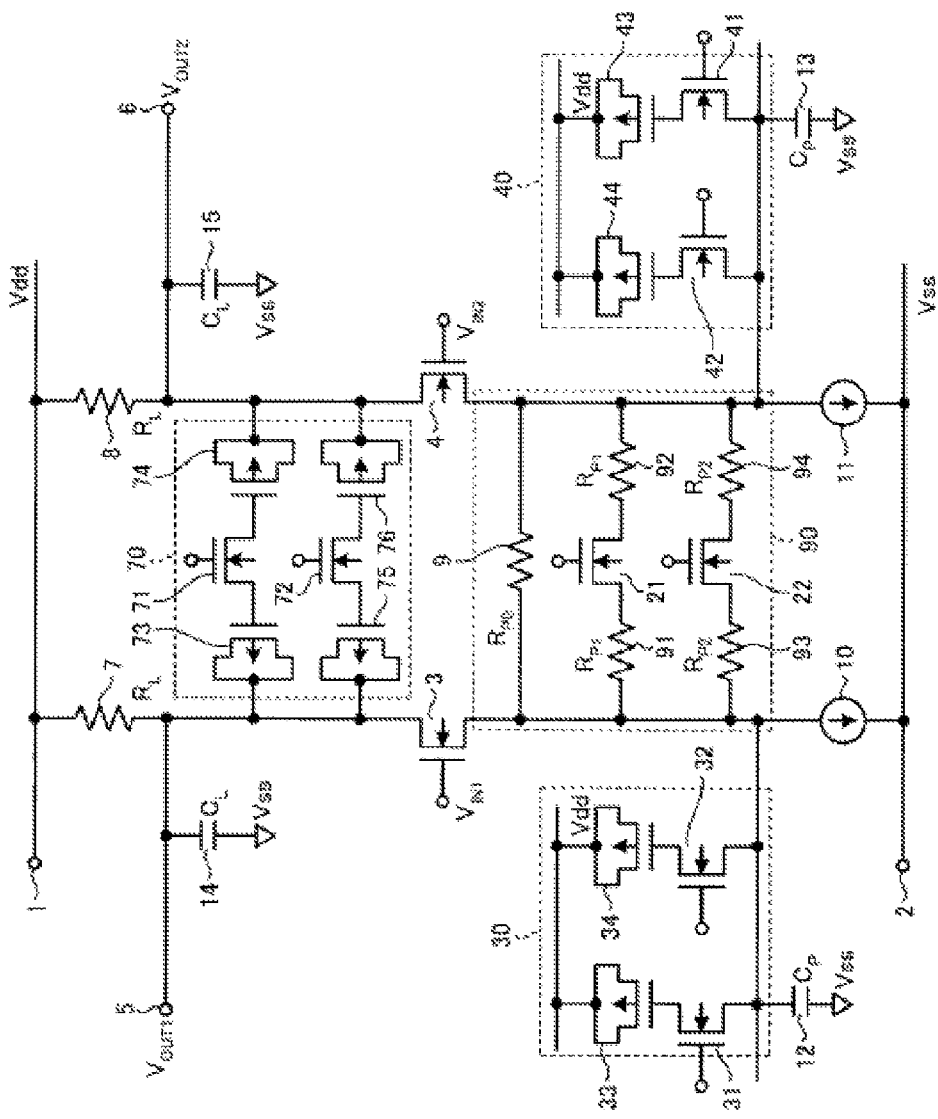
FIG. 3 is a circuit diagram depicting a variable gain amplifier according to a second embodiment.

FIG. 3 is a circuit diagram depicting a second embodiment. Here, the same reference numerals which correspond to features in FIG. 1 are adopted and will not be explained in detail again. In the second embodiment, a variable capacitance 70 is connected between the drain electrodes of the NMOS transistors 3, 4 that form a differential pair. Here, the variable capacitor 70 has plural capacitance sections of serial circuits of the MOS capacitors and the MOS transistors. As an example, FIG. 3, shows a serial circuit (capacitance section) including an NMOS transistor 71 and two PMOS capacitors 73, 74, and a serial circuit (capacitance section) including an NMOS transistor 72 and two PMOS capacitors 75, 76. By turning on/off the NMOS transistors 71, 72 of the variable capacitor 70, it is possible to adjust the number of the PMOS capacitors connected between the drain electrodes of the NMOS transistors 3, 4. As a result, it is possible to adjust the capacitance value between the drain electrodes of the NMOS transistors 3, 4.

According to the second embodiment, the capacitance value $C_{LSW}$ of the variable capacitor 70 is adjusted corresponding to changes in the resistance value $R_P$ of the variable resistor 90 in the gain setting, so that it is possible to have the polar frequency $\omega_{P1}$ in agreement with the zero point frequency $\omega_Z$, or approximately so. As the common variable capacitor is connected between the drain electrodes of the NMOS transistors 3, 4 that form a differential pair, it is easy to control the capacitance value for having the polar frequency be in agreement with the zero point frequency, or approximately so. In addition, just as in this embodiment, one may also adopt a scheme in which the first and second variable capacitors connected to the source electrodes of the NMOS transistors that form a differential pair are replaced with the variable capacitor commonly connected between the source electrodes. In this way, the variable gain amplifier in this embodiment can have a flat frequency characteristics in a wide frequency band.

In the above, an explanation has been made for the configuration wherein the gain is set by changing the resistance value of the variable resistor connected between the source electrodes of the NMOS transistors that form a differential pair. However, one may also adopt a scheme in which the load resistance is varied to adjust the gain. In this configuration, too, corresponding to the setting of the resistance value of the load resistor, it is possible to adjust the capacitance value of the variable capacitor and to have the polar frequency in agreement with the zero point frequency under control, or approximately so.

In addition, in the above explanation, the embodiment uses the NMOS transistors as the transistors for forming the differential pair. However, it is also possible to use the PMOS transistors to form the differential pair. Additionally, it is possible to use bipolar transistors as the transistors of the differential pair. In addition, in the explanation of the embodiments, the polar frequency and the zero point frequency are made in agreement with each other. However, one may also adopt a scheme in which they are not fully in agreement with each other, and the two frequencies are only close to each other. In this case, too, it is possible to have a flat gain characteristic, and to improve the frequency characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A variable gain amplifier, comprising:
a differential transistor pair including a first transistor and a second transistor, the first and second transistors each having a first electrode, a second electrode, and a gate electrode;
a variable resistor connected between the first electrode of the first transistor and the first electrode of the second transistor;
a first variable capacitor connected to the first electrode of the first transistor;
a second variable capacitor connected to the first electrode of the second transistor;
a third variable capacitor connected to the second electrode of the first transistor; and
a fourth variable capacitor connected to the second electrode of the second transistor.

2. A variable gain amplifier, comprising:
a differential transistor pair including a first transistor and a second transistor, the first and second transistors each having a first electrode, a second electrode, and a gate electrode;
a variable resistor connected between the first electrode of the first transistor and the first electrode of the second transistor;
a first variable capacitor connected to the first electrode of the first transistor;
a second variable capacitor connected to the first electrode of the second transistor; and
a third variable capacitor connected between the second electrode of the first transistor and the second electrode of the second transistor.

3. The variable gain amplifier according to claim 2, wherein the third variable capacitor comprises a plurality of capacitance sections that are connected in parallel, the capacitance sections each including a first capacitor and a second capacitor connected in series with a switching element, the first capacitor connected between the first transistor and the switching element, and the second capacitor connected between the second transistor and the switching element.

4. A variable gain amplifier, comprising:
a differential transistor pair including a first transistor and a second transistor, the first and second transistors each having a first electrode, a second electrode, and a gate electrode;
a variable resistor connected between the first electrode of the first transistor and the first electrode of the second transistor;
a first variable capacitor connected to the first electrode of the first transistor;
a second variable capacitor connected to the first electrode of the second transistor;
a third variable capacitor connected to the second electrode of the first transistor; and
a fourth variable capacitor connected to the second electrode of the second transistor, wherein
the first through fourth variable capacitors have capacitance values that cause a polar frequency and a zero point frequency to be equal to each other for a resistance value of the variable resistor that controls a gain setting.

5. The variable gain amplifier according to claim 4, wherein the differential transistor pair, the variable resistor, and the first through fourth variable capacitors are components of an integrated circuit fabricated with a complementary metal-oxide-semiconductor (CMOS) technology.

6. The variable gain amplifier according to claim 5, wherein the variable resistor comprises a plurality of resistance sections that are connected in parallel, the resistance sections each including a first resistor and a second resistor connected in series with a switching element, the first resistor connected between the first transistor and the switching element, the second resistor connected between the second transistor and the switching element.

7. The variable gain amplifier according to claim 6, wherein the switching element is an n-channel metal-oxide-semiconductor (NMOS) transistor.

8. A method of controlling a variable gain amplifier that has a differential transistor pair including a first transistor and a second transistor, the first and second transistors each having a first electrode, a second electrode, and a gate electrode; a variable resistor connected between the first electrode of the first transistor and the first electrode of the second transistor; a first variable capacitor connected to the first electrode of the first transistor; a second variable capacitor connected to the first electrode of the second transistor, a third variable capacitor connected to the second electrode of the first transistor; and a fourth variable capacitor connected to the second electrode of the second transistor, the steps of the method comprising:
setting a gain amount by setting a resistance value of the variable resistor;
setting a capacitance value of at least one of the first through fourth variable capacitor such that a polar frequency of the variable gain amplifier and a zero point frequency of the variable gain amplifier become equal to each other.

9. The method of claim 8, wherein when the resistance value of the variable resistor is increased, capacitance values of the third variable and the fourth variable capacitor are increased so that the polar frequency and the zero point frequency become equal, and when the resistance value of the variable resistor is decreased, capacitance values of the first variable capacitor and the second variable capacitor are increase so that the polar frequency and the zero point frequency become equal.

10. The method of claim 8, wherein the variable resistor comprises a plurality of resistance sections that are connected in parallel, the resistance sections each including a resistor connected in series with a switching element.

* * * * *